(12) United States Patent
Sato et al.

(10) Patent No.: US 8,773,373 B2
(45) Date of Patent: Jul. 8, 2014

(54) DISPLAY APPARATUS WITH TOUCH PANEL AND PIEZOELECTRIC ACTUATOR

(75) Inventors: Tatsuo Sato, Toyama (JP); Tadao Sunahara, Toyama (JP); Yasuyoshi Nabeyama, Toyama (JP)

(73) Assignee: Hokuriku Electric Industry Co., Ltd., Toyama-Shi (JP)

( * ) Notice: Subject to any disclaimer, the term of this patent is extended or adjusted under 35 U.S.C. 154(b) by 854 days.

(21) Appl. No.: 12/995,856

(22) PCT Filed: Jun. 5, 2008

(86) PCT No.: PCT/JP2008/060398
§ 371 (c)(1),
(2), (4) Date: Feb. 28, 2011

(87) PCT Pub. No.: WO2009/147741
PCT Pub. Date: Dec. 10, 2009

(65) Prior Publication Data
US 2011/0141046 A1     Jun. 16, 2011

(51) Int. Cl.
| G06F 3/041 | (2006.01) |
| H01L 41/00 | (2013.01) |
| H02N 2/00 | (2006.01) |
| G01L 7/08 | (2006.01) |
| H01B 5/14 | (2006.01) |
| H01L 41/22 | (2013.01) |
| G06F 3/01 | (2006.01) |
| H01L 41/083 | (2006.01) |
| H01L 41/09 | (2006.01) |

(52) U.S. Cl.
CPC .......... *G06F 3/041* (2013.01); *G06F 3/016* (2013.01); *H01L 41/083* (2013.01); *H01L 41/0973* (2013.01)
USPC ............. 345/173; 310/314; 310/317; 73/715; 174/126.4; 29/25.35

(58) Field of Classification Search
USPC ....... 239/533.2; 252/586; 247/690; 29/25.35; 310/15, 311, 313 B, 314, 317, 319, 321, 310/328, 339, 358; 327/517; 345/173, 177, 345/204, 589; 349/58–60; 438/455, 50, 438/736; 445/24; 606/169; 73/15, 723
See application file for complete search history.

(56) References Cited

U.S. PATENT DOCUMENTS 5,369,862 A * 12/1994 Kotani et al. ............... 29/25.35
2005/0160823 A1 * 7/2005 Zdeblick et al. ............... 73/715
(Continued)

FOREIGN PATENT DOCUMENTS

| JP | 2004-094389 | 3/2004 |
| JP | 2005-149405 | 6/2005 |

(Continued)

*Primary Examiner* — Quan-Zhen Wang
*Assistant Examiner* — Lin Li
(74) *Attorney, Agent, or Firm* — Rankin, Hill & Clark LLP

(57) ABSTRACT

Provided herein are a display apparatus with a touch panel to which a piezoelectric actuator may readily be mounted, and a piezoelectric actuator used in such a display apparatus with a touch panel. A support structure for supporting a piezoelectric actuator 3 on a front surface of a circuit substrate 5 is constituted from a pair of electrically conductive support members 13A, 13B which are each formed of an electrically conductive foam. The piezoelectric actuator 3 may be mounted by locating the piezoelectric actuator 3 with the pair of electrically conductive support members 13A, 13B attached thereto in a predetermined position on the circuit substrate 5, and connecting the pair of electrically conductive support members 13A, 13B to the pair of output electrodes 5A, 5B of the circuit substrate 5.

11 Claims, 4 Drawing Sheets

(56) References Cited

U.S. PATENT DOCUMENTS

| | | |
|---|---|---|
| 2007/0001031 A1 | 1/2007 | Sasaki |
| 2007/0080951 A1* | 4/2007 | Maruyama et al. ............ 345/173 |
| 2007/0146334 A1 | 6/2007 | Inokawa |
| 2008/0029292 A1* | 2/2008 | Takayama et al. ......... 174/126.4 |
| 2008/0100177 A1* | 5/2008 | Dai et al. ....................... 310/317 |
| 2008/0122315 A1* | 5/2008 | Maruyama et al. ............ 310/314 |
| 2008/0278033 A1* | 11/2008 | Adachi et al. ................. 310/317 |

FOREIGN PATENT DOCUMENTS

| | | |
|---|---|---|
| JP | 2005-340387 | 12/2005 |
| JP | 2006-195734 | 7/2006 |
| JP | 2006-215738 | 8/2006 |
| JP | 2007-094993 | 4/2007 |

* cited by examiner

DISPLAY APPARATUS WITH TOUCH PANEL AND PIEZOELECTRIC ACTUATOR

TECHNICAL FIELD

The present invention relates to a display apparatus with a touch panel which is used as a display screen of a cellular phone and an automated teller machine, and also relates to a piezoelectric actuator used in such display apparatus.

BACKGROUND ART

Japanese Patent Application Publication No. 2006-215738 (JP2006-215738A) discloses a display apparatus with a touch panel using a piezoelectric actuator. The display apparatus includes a touch panel provided with a touch switch and a piezoelectric actuator mechanically connected to the touch panel. The piezoelectric actuator includes a metal diaphragm, piezoelectric elements formed on a front surface and a back surface of the metal diaphragm, and a pair of input electrodes. The piezoelectric elements each include a first electrically conductive layer, a second electrically conductive layer, and a piezoelectric layer. The first and second electrically conductive layers are stacked or overlaid via the piezoelectric layer. The first electrically conductive layer is electrically connected to one of the input electrodes. The second electrically conductive layer is connected to the metal diaphragm. The metal diaphragm is electrically connected to the other input electrode. When an operator touches the surface of the touch panel of the display apparatus with a finger, the touch switch detects that touch panel is touched by the operator and turns on the switch. Once the switch has properly been turned on, a current flows across the pair of input electrodes of the piezoelectric actuator to vibrate the piezoelectric actuator. Then, the touch panel vibrates. Thus, even an operator with visual or aural disabilities may tactually recognize that the switch has properly been turned.

SUMMARY OF THE INVENTION

Technical Problem

In such display apparatus with a touch panel, however, it is necessary to connect, using lead wires, the pair of input electrodes of the piezoelectric actuator to the electrodes of an actuator drive circuit operable to drive the piezoelectric actuator, thereby complicating the mounting of the actuator.

An object of the present invention is to provide a display apparatus with a touch panel to which a piezoelectric actuator may readily be mounted, and a piezoelectric actuator for use in the display apparatus.

Another object of the present invention is to provide a display apparatus with a touch panel which is capable of detecting the magnitude of a force applied by an operator with a finger to the touch panel and for which the number of parts may be reduced.

Solution to Problem

A display apparatus with a touch panel according to the present invention may comprise a touch panel, a piezoelectric actuator, and a circuit substrate. The touch panel includes a touch switch operable to detect that a front surface of the touch panel or the touch switch is touched by an operator with a finger. The piezoelectric actuator is mechanically connected to the touch panel to vibrate the touch panel when the touch switch is touched by the operator with the finger. The circuit substrate is spaced away from the back surface of the touch panel, and includes at least a drive circuit for driving the piezoelectric actuator. More specifically, the piezoelectric actuator is mechanically connected to a back surface of the touch panel such that vibration generated when the piezoelectric actuator is driven by the drive circuit may be transmitted to the touch panel. The piezoelectric actuator is supported via a support structure on a front surface of the circuit substrate. A back surface of the piezoelectric actuator faces the circuit substrate, and the piezoelectric actuator includes a pair of input electrodes which are disposed at predetermined intervals on the back surface of the piezoelectric actuator. The support structure for supporting the piezoelectric actuator is disposed between the pair of output electrodes of the drive circuit provided on the circuit substrate and the pair of input electrodes of the piezoelectric actuator. The support structure is formed of a pair of electrically conductive support members having electrical conductivity and elasticity and capable of electrically connecting the pair of input electrodes of the piezoelectric actuator and the pair of output electrodes of the drive circuit. Thus, the support structure supports the piezoelectric actuator such that the vibration of the piezoelectric actuator may not be suppressed as much as possible.

In the present invention, the support structure for supporting the piezoelectric actuator on the front surface of the circuit substrate is formed of the pair of electrically conductive support members having electrical conductivity and elasticity. Thus, the piezoelectric actuator may be mounted on the circuit substrate simply by locating at a predetermined position the piezoelectric actuator with the pair of electrically conductive support members attached thereto and then connecting the pair of electrically connected support members to the pair of output electrodes of the drive circuit. This configuration eliminates the need of using lead wires to connect the input electrodes of the piezoelectric actuator and the output electrodes of the drive circuit for driving the piezoelectric actuator, thereby facilitating the mounting of the piezoelectric actuator.

The electrically conductive support members may be each formed of an electrically conductive foam. The electrically conductive foam has a sponge-like structure and electrical conductivity. The foam is suitable to form the pair of electrically conductive support members since the foam has electrical conductivity and elasticity.

The piezoelectric actuator may be shaped in an elongated plate, and the pair of input electrodes may be disposed on both ends of the piezoelectric actuator, as seen in a longitudinal direction of the piezoelectric actuator. In this configuration, an elastic member may preferably be provided for mechanically connecting the piezoelectric actuator and the touch panel and connected to the back surface of the touch panel and a front surface portion of the piezoelectric actuator. The front surface portion is opposed to a middle portion between the pair of input electrodes. In this configuration, the pair of electrically conductive support members are located at both ends of the piezoelectric actuator as seen in a longitudinal direction of the piezoelectric actuator, and the elastic member is located in the middle portion opposed to the location where the pair of electrically conductive support members of the piezoelectric actuator are located. Thus, the piezoelectric actuator may be supported by a small number of members, namely, the pair of electrically conductive support members and the elastic member. The piezoelectric actuator vibrates as if the pair of electrically conductive support members work as nodes, the middle portion of the piezoelectric actuator, where the elastic member is located, vibrates up and down with respect to the circuit substrate, as seen on the pages of the figures, thereby vibrating the touch panel in the same direction as the middle portion of the piezoelectric actuator.

When the surface portion is connected to the back surface of the touch panel with the elastic member, the touch panel may preferably be made of glass. Since glass is relatively hard, it is suitable for the touch panel. The touch panel made of glass may vibrate strongly in the direction as mentioned above.

The piezoelectric actuator may be attached to the touch panel via an adhesive layer without using the elastic member. In this configuration, the bending of the piezoelectric actuator is directly transmitted to the touch panel, thereby vibrating the touch panel as if the panel waves. In this case, the touch panel may preferably be made of a synthetic resin. Since a synthetic resin is relatively elastic, it is suitable for the touch panel. The touch panel made of a synthetic resin may vibrate as if it waves.

The piezoelectric actuator may include a metal diaphragm having a front surface, which faces the back surface of the touch panel, and a back surface, and a piezoelectric element formed on the back surface of the metal diaphragm. In this configuration, the piezoelectric element includes a first electrically conductive portion connected to the metal diaphragm, a piezoelectric portion, a second electrically conductive portion opposed to the first electrically conductive portion via the piezoelectric portion, and an electrically conductive connecting path connected to the first electrically conductive portion. A part of the electrically conductive connecting path and a part of the second electrically conductive portion are formed at portions of the piezoelectric element that are opposed to the circuit substrate. One of the pair of input electrodes may be formed by the part of the electrically conductive connecting path. The other input electrode may be formed by the part of the second electrically conductive portion. Thus, the pair of input electrodes may be disposed at intervals in a longitudinal direction of the piezoelectric actuator on a surface which is opposed to the circuit substrate.

The piezoelectric portion may include a plurality of piezoelectric layers. In this configuration, the first electrically conductive portion includes a plurality of first electrically conductive layers and a first coupling portion for coupling the first electrically conductive layers. The second electrically conductive portion includes a plurality of second electrically conductive layers and a second coupling portion for coupling the second electrically conductive layers. The second electrically conductive layer faces the first electrically conductive layer via the piezoelectric layer. The piezoelectric element includes a first side surface and a second side surface at both ends thereof in the longitudinal direction. The first and second coupling portions are respectively formed on the first and second side surfaces. The electrically conductive connecting path includes a side connecting portion and an opposed connecting portion. An outermost piezoelectric layer in the piezoelectric layers faces the circuit substrate. The side connecting portion is formed on the first side surface which is partially constituted from a side part of the outermost piezoelectric layer. The opposed connecting portion is formed on a surface of the outermost piezoelectric layer. The side connecting portion is connected to the first coupling portion.

With this configuration, a multi-layered piezoelectric element may be formed in a relatively simple structure, and the amplitude of the piezoelectric actuator may be increased.

At least one of the electrically conductive support members may be formed of a force sensor operable to detect the magnitude of a force applied to the touch panel by the operator with the finger. In this configuration, additional functionality may be provided, such as fast scrolling of a display screen according to the magnitude of the force applied to the touch panel. The force sensor may include a contact having electrical conductivity and configured to be in contact with at least one of the input electrodes, and an electrically conductive path including the contact and electrically connected to the output electrode on the circuit substrate. This configuration allows electric power for driving the piezoelectric actuator to be supplied to the pair of input electrodes of the piezoelectric actuator via the force sensor, thereby eliminating the need of providing dedicated wiring for power feeding.

When at least one of the electrically conductive support members is formed of a force sensor, the force sensor detects the magnitude of a force caused by the vibration of the force sensor itself when the piezoelectric actuator vibrates. A circuit may preferably be configured not to detect such a force caused by the vibration of the force sensor.

Different types of force sensors may arbitrarily be used. For example, the force sensor may include a semiconductor element formed with a plurality of diffused resistors, operable to bend according to a transition of the contact and output an electrical signal according to an amount of the bending of the semiconductor element, and the contact may be formed of an electrically conductive sphere. The electrically conductive path may include a contact electrode formed on the semiconductor element to be in contact with the sphere and a wiring pattern formed on the semiconductor element and electrically connected to the contact electrode. When the force sensor thus configured is used as the conductive support member, the following may be possible merely by bringing the contact into contact with the input electrodes of the piezoelectric actuator: it may readily be detected that the operator touches the touch panel; the piezoelectric actuator may readily be supported; and electric power may readily be supplied to the piezoelectric actuator. Thus, the force sensor may readily be disposed, being electrically connected to the piezoelectric actuator.

The contact of the force sensor may alternatively be a contact having electrical conductivity and fixed to a corresponding input electrode. This may prevent contact failure between the contact of the force sensor and the input electrodes. In this configuration, the piezoelectric actuator may readily be positioned merely by fitting the contact in a casing for the force sensor provided on the circuit substrate.

A piezoelectric actuator according to the present invention may comprise a metal diaphragm having a front surface and a back surface, and a piezoelectric element formed on the back surface of the metal diaphragm. The piezoelectric element includes a first electrically conductive portion connected to the metal diaphragm, a piezoelectric portion, a second electrically conductive portion opposed to the first electrically conductive portion via the piezoelectric portion, and an electrically conductive connecting path connected to the first electrically conductive portion. A part of the electrically conductive connecting path and a part of the second electrically conductive portion are formed at portions of the piezoelectric element that are located on an opposite side to the metal diaphragm. The part of the electrically conductive connecting path and the part of the second electrically conductive portion form a pair of input electrodes for the piezoelectric element. In this configuration, the pair of input electrodes may be disposed at intervals on one of the surfaces of the piezoelectric actuator, thereby facilitating external electrical connection of the input electrodes.

The support structure may be disposed between a central portion of the piezoelectric actuator in a longitudinal direction thereof and an attachment portion such that the vibration of the piezoelectric actuator may not be suppressed as much as possible. Further, an elastic member may be provided on each end of the piezoelectric actuator in the longitudinal direction for mechanically connecting the piezoelectric actuator and the touch panel. In this configuration, the elastic member is connected to a front surface portion of the piezoelectric actuator and also to the back surface of the touch panel. By appropriately determining the height of the support structure, different members may effectively be disposed in a wide area on the attachment portion.

BEST MODE FOR CARRYING OUT THE INVENTION

Figure 1:
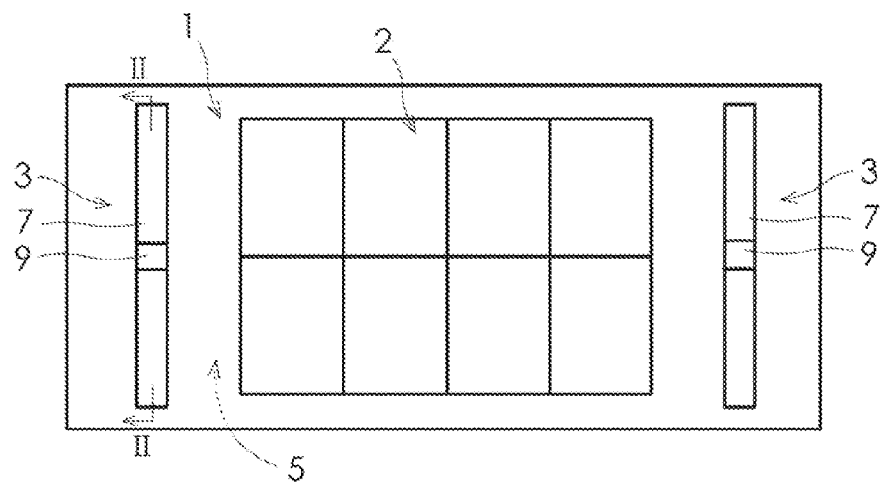
FIG. 1 is a plan view of a display apparatus with a touch panel according to an embodiment of the present invention.
Figure 2:
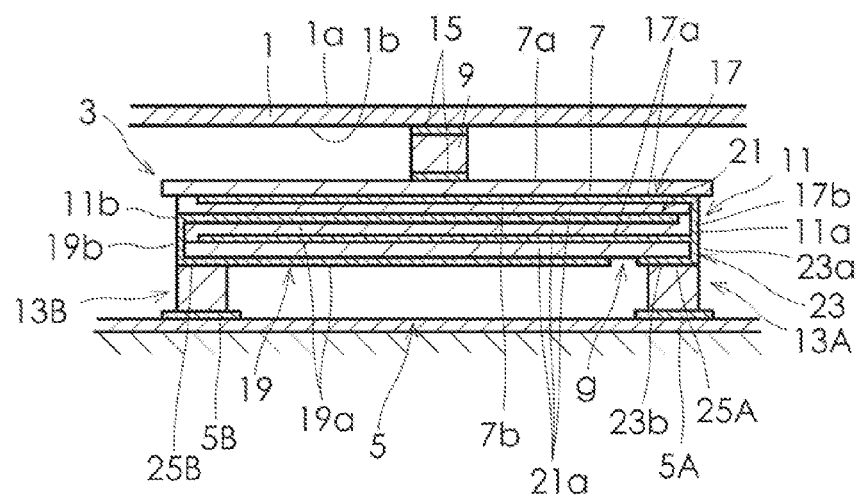
FIG. 2 is a cross sectional view of the display apparatus of FIG. 1 as taken along line II-II.

Now, embodiments of the present invention will be described below in detail with reference to the drawings. FIG. 1 is a plan view of a display apparatus with a touch panel according to an embodiment of the present invention, showing a configuration of major components. FIG. 2 is a cross sectional view of the display apparatus of FIG. 1 as taken along line II-II. In FIG. 2, thickness dimensions are drawn with exaggeration for easy understanding. As illustrated in these two figures, a display apparatus of the present embodiment includes a touch panel 1, two piezoelectric actuators 3, and a circuit substrate 5. In FIG. 1, a casing for receiving the touch panel 1 and the circuit substrate 5 is not illustrated. The touch panel 1 is shaped in a short rectangle and made of transparent plate glass. A switch display portion 2 of a touch switch is provided on a front surface of the touch panel 1. The touch switch is formed of a transparent electrode, and is turned on when touched by an operator with a finger. Details of the display portion 2 are not illustrated.

The two piezoelectric actuators 3 are disposed on both ends of the touch panel 1 as seen in a longitudinal direction of the touch panel 1. Referring to FIG. 2, the structure of one of the piezoelectric actuators will be described below. The piezoelectric actuator 3 is shaped in an elongated plate and includes a metal diaphragm 7, an elastic member 9, a piezoelectric element 11, and a pair of electrically conductive support members 13A, 13B. In the present embodiment, it is detected by the touch switch including the switch display portion 2 whether or not the switch display portion 2 is touched by the operator with a finger. When the touch switch is turned on, a drive circuit, not illustrated, for driving the piezoelectric actuator, which is provided on the circuit substrate 5, feeds a drive signal or electric power to the piezoelectric actuator 3, and then the piezoelectric actuator 3 is driven to vibrate.

The metal diaphragm 7 may be made of stainless steel or 4-2 alloy, for example. The metal diaphragm is shaped in a short rectangle and has a front surface 7a and a back surface 7b. The front surface 7a is opposed to a back surface 1b of the touch panel 1 via the elastic member 9. In the present embodiment, the elastic member 9 is made of a synthetic resin material having elasticity. Specifically, "PORON H-48" available from Inoac Corporation is used as an elastic material. The elastic member 9 is attached to a surface portion of the piezoelectric actuator 3 and also to the back surface 1b of the touch panel 1 using a double-faced adhesive tape 15. The surface portion of the piezoelectric actuator 3 is opposed to a middle portion between a pair of input electrodes 25A, 25B which will be described later. The piezoelectric actuator 3 and the touch panel 1 are thus configured to be mechanically connected or coupled to each other.

The piezoelectric element 11 is formed on the back surface 7b of the metal diaphragm 7. The piezoelectric element 11 includes a first electrically conductive portion 17, a piezoelectric portion 21, a second electrically conductive portion 19, and an electrically conductive connecting path 23. The first electrically conductive portion 17 includes two first electrically conductive layers 17a and a first coupling portion 17b for coupling the two first electrically conductive layers 17a. Out of the two first electrically conductive layers 17a, the first electrically conductive layer 17a located to a side of the metal diaphragm 7 is attached to the back surface 7b of the metal diaphragm 7. Likewise, the second electrically conductive portion 19 includes two second electrically conductive layers 19a and a second coupling portion 19b for coupling the second electrically conductive layers 19a. The piezoelectric portion 21 includes three piezoelectric layers 21a formed of piezoelectric ceramic. One piezoelectric layer 21a is formed between one first electrically conductive layer 17a and one second electrically conductive layer 19a. Thus, the first electrically conductive layer 17a faces the second electrically conductive layer 19a via the piezoelectric layer 21a. The piezoelectric element 11 has a first side surface 11a and a second side surface 11b at ends of the piezoelectric element 11 in the longitudinal direction. The first coupling portion 17b and the second coupling portion 19b are respectively formed on the first side surface 11a and the second side surfaces 11b.

An outermost piezoelectric layer 21a in the three piezoelectric layers 21a faces the circuit substrate 5. The electrically conductive connecting path 23 is formed on the outermost piezoelectric layer 21a. The electrically conductive connecting path 23 includes a side connecting portion 23a and an opposed connecting portion 23b. The side connecting portion 23a is formed on the first side surface 11a which is partially constituted from a side part of the outermost piezoelectric layer 21a, and an end portion of the side connecting portion 23a is connected to the first coupling portion 17b of the first electrically conductive portion 17. The opposed connecting portion 23b is formed on a surface of the outermost piezoelectric layer 21a that faces the circuit substrate 5, and is continuous with the side connecting portion 23a. A gap g is formed between the opposed connecting portion 23b and the second electrically conductive layer 19a formed on the outermost piezoelectric layer 21a to prevent the contact therebetween. In the present embodiment, a part of the electrically conductive connecting path 23, namely, the opposed connecting portion 23b forms one input electrode 25A of the pair of the input electrodes 25A, 25B. A part of the second electrically conductive portion 19, namely, a portion of the second electrically conductive layer 19a formed on the outermost piezoelectric layer 21a facing the circuit substrate 5 and located away from the opposed connecting portion 23b forms the other input electrode 25B of the pair of the input electrodes 25A, 25B. In other words, the one input electrode 25A, namely, the part of the electrically conductive connecting path 23, and the other input electrode 25B, namely, the part of the second electrically conductive portion 19, are formed on a side of the piezoelectric element 11 opposite to the metal diaphragm 7. Thus, the first electrically conductive portion 17 is electrically connected to the one input electrode 25A, and the second electrically conductive portion 19 is electrically connected to the other input electrode 25B. In the present embodiment, the first electrically conductive portion 17, the second electrically conductive portion 19, and the electrically conductive connecting path 23 are formed by printing using a glass silver paste. The piezoelectric layer 21a is formed by sintering a green sheet of piezoelectric ceramic. The glass silver paste for forming the electrically conductive layers is also sintered at the same time as the green sheet is sintered. The sintering of the electrically conductive layers and that of the piezoelectric layers may be done in an arbitrary order. The first coupling portion 17b of the first electrically conductive portion 17, the second coupling portion 19b of the second electrically conductive portion 19, and the electrically conductive connecting path 23 are formed after all of the electrically conductive layers and piezoelectric layers have been sintered. In the present embodiment, there are three piezoelectric layers 21a. In order to sufficiently increase the amplitude of the piezoelectric actuator, the first electrically conductive layers 17a, the second electrically conductive layers 19a, and the piezoelectric layers 21a may preferably be stacked so that there may be at least ten piezoelectric layers 21a.

The input electrodes 25A, 25b thus formed are disposed on the back surface of the piezoelectric actuator 3 facing the circuit substrate 5 at both ends of the piezoelectric actuator 3 in the longitudinal direction of the piezoelectric actuator 3.

The pair of electrically conductive support members 13A, 13B are each formed of an electrically conductive foam having a shape of a rectangular parallelepiped. The electrically conductive support members are disposed between the piezoelectric actuator 3 and the circuit substrate 5. The electrically conductive foams are made of a polyurethane resin in which Ni or nickel powder is dispersed. The electrically conductive foams have both electrical conductivity and elasticity. In the present embodiment, GS8000 available from W.L. Gores & Associates, Inc. is used for the electrically conductive foam. One electrically conductive support member 13A in the pair of the electrically conductive support members 13A, 13B is connected to one input electrode 25A in the pair of input electrodes 25A, 25B, and also connected to one output electrode 5A in a pair of output electrodes 5A, 5B provided on the circuit substrate 5, using an electrically conductive and pressure sensitive adhesive. Likewise, the other electrically conductive support member 13B in the pair of the electrically conductive support members 13A, 13B is connected to the other input electrode 25B in the pair of input electrodes 25A, 25B, and also connected to the other output electrode 5B in the pair of output electrodes 5A, 5B provided on the circuit substrate 5, using the electrically conductive and pressure sensitive adhesive. The pair of electrically conductive support members 13A, 13B support the piezoelectric actuator 3 on the front surface of the circuit substrate 5 such that the vibration of the piezoelectric actuator 3 may not be suppressed as much as possible. The piezoelectric actuator 3 is thus supported on the front surface of the circuit substrate 5 via a support structure constituted from the pair of electrically conductive support members 13A, 13B.

The display apparatus with a touch panel of the present embodiment works as follows. First, when the operator touches the switch display portion 2 of touch panel 1 with a finger, the touch switch, not illustrated, detects the contact by the operator. In response to the detected contact, the drive circuit, not illustrated but provided on the circuit substrate 5, for driving the piezoelectric actuator 3 feeds a drive signal or electric power to the pair of input electrodes 25A, 25B of the piezoelectric actuator 3 via the output electrodes 5A, 5B of the drive circuit. Once the drive signal has been fed into the pair of input electrodes 25A, 25B, the piezoelectric actuator 3 vibrates as if the pair of electrically conductive support members 13A, 13B work as nodes. As a result, the central portion of the piezoelectric actuator 3, where the elastic member 9 is disposed, vibrates or moves up and down with respect to the circuit substrate 5, as seen on the pages of the figures. Thus, the touch panel 1 is vibrated. This allows even an operator with visual or aural disabilities to tactually recognize that the switch is properly turned on. The period for which the piezoelectric actuator vibrates may be determined by setting a timer. Alternatively, the piezoelectric actuator 3 may be set to vibrate while the touch switch is turned on.

In the present embodiment, the support structure for supporting the piezoelectric actuator 3 on the front surface of the circuit substrate 5 is constituted from the pair of electrically conductive support members 13A, 13B which are each formed of the electrically conductive foam. The piezoelectric actuator 3 may readily be mounted on the circuit substrate 5 simply by locating at a predetermined position the piezoelectric actuator 3 with the pair of electrically conductive support members 13A, 13B attached thereto and then connecting the pair of electrically connected support members 13A, 13B to the pair of output electrodes 5A, 5B of the circuit substrate 5. Unlike conventional approaches, in the present embodiment, the need of using lead wires to connect the input electrodes of the piezoelectric actuator and the output electrodes of the drive circuit is eliminated, thereby facilitating the mounting of the piezoelectric actuator.

In the embodiment described so far, the touch switch formed of a transparent electrode is provided on the touch panel for detecting whether or not the touch panel is touched by the operator with the finger. The piezoelectric actuator may be utilized as a touch switch. In this case, a detection circuit may be provided on the circuit substrate 5 for detecting a piezoelectric voltage generated in the piezoelectric element of the piezoelectric actuator when the touch panel 1 is pressed. An output from the detection circuit activates the drive circuit for driving the piezoelectric actuator, and then the activated drive circuit feeds a drive signal to the pair of input electrodes of the piezoelectric actuator. Thus, the piezoelectric actuator works to detect the touching on the touch panel and also to vibrate the touch panel, thereby reducing the number of parts for the display apparatus with a touch panel.

Figure 3:
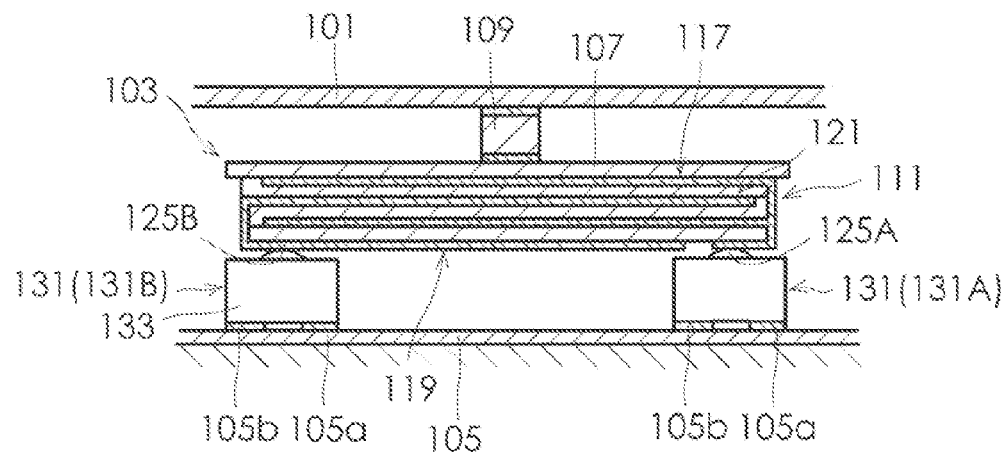
FIG. 3 is a cross sectional view of a display apparatus with a touch panel according to another embodiment of the present invention.
Figure 4:
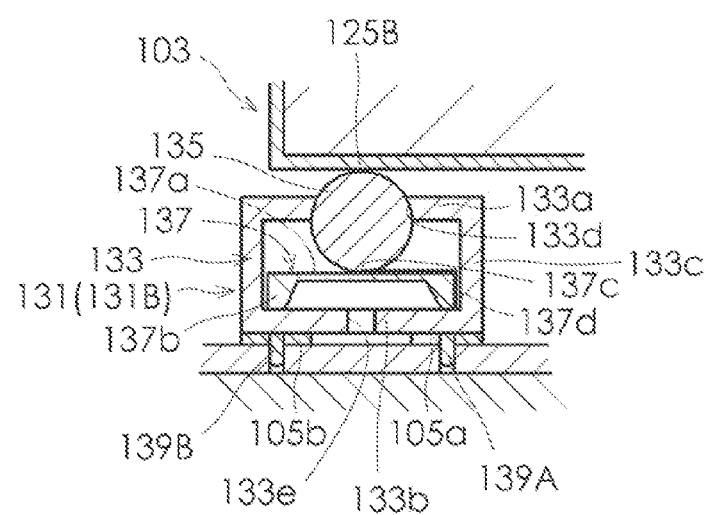
FIG. 4 is a partial cross sectional view of the display apparatus of FIG. 3.

FIG. 3 is a cross sectional view of a display apparatus with a touch panel according to another embodiment of the present invention. In this embodiment, force sensors, which are semiconductor sensors, are used as the pair of electrically conductive support members in place of the electrically conductive foams. Other parts of the display apparatus with a touch panel are the same as those of the previous embodiment shown FIGS. 1 and 2. The similar parts to the embodiment shown in FIGS. 1 and 2 are allocated reference numerals or signs obtained by adding 100 to those of the parts of the previous embodiment, and descriptions thereof are omitted. In this embodiment, a pair of electrically conductive support members 131 used in a piezoelectric actuator are constituted from a pair of semiconductor force sensors 131 operable to detect the magnitude of a force applied to a touch panel 101 by an operator with a finger. As illustrated in FIG. 4, the semiconductor force sensors each include a casing 133, an electrically conductive sphere 135 forming a contact, a semiconductor element 137, and a plurality of terminals 139A, 139B. The casing 133 is shaped in a rectangular parallelepiped box. The casing 133 includes an upper wall portion 133a opposed to a piezoelectric element 111, a lower wall portion 133b opposed to the upper wall portion 133a, and a peripheral wall portion 133c connecting the upper and lower wall portions 133a, 133b. A circular opening portion 133d is formed through the upper wall portion 133a in a central portion thereof. A hole portion 133e is formed in a central portion of the lower wall portion 133b. The sphere 135 forming the contact is made of a metal having electrical conductivity. The sphere 135 partially projects out of the opening portion 133d of the casing 133. The opening portion 133d has a small diameter than that of the sphere 135. Therefore, the volume of a portion of the sphere that projects out of the opening portion 133d is equal to or less than half of the volume of the entire sphere, and the sphere 135 will not come out of the opening portion 133d. The sphere 135 of one semiconductor force sensor 131A in the pair of semiconductor force sensors 131 is in contact with the one input electrode 125A. The sphere 135 of the other semiconductor force sensor 131B in the pair of semiconductor force sensors 131 is in contact with the other input electrode 125B.

The semiconductor element 137 includes a diaphragm portion 137a and a cylindrical support portion 137b unitarily connected to and formed around the diaphragm portion 137a for supporting the diaphragm portion 137a. The sphere 135 is disposed in the center of the diaphragm portion 137a. The diaphragm portion 137a is operable to bend according to a transition of the sphere 135 and is formed with a plurality of diffused resistors, not illustrated, operable to output an electrical signal according to an amount of bending of the diaphragm 137a. A contact electrode 137c is formed on the diaphragm portion 137a to be in contact with the sphere 135. A wiring pattern 137d is formed on the semiconductor element 137 to be electrically connected to the contact electrode 137c. The contact electrode 137c and the wiring pattern 137d are formed of an electrically conductive material of aluminum or gold, for example, on the semiconductor element 137 by using thin film forming technique. In this embodiment, the contact electrode 137c and the wiring pattern 137d constitute an electrically conductive connecting path.

A part of the plurality of terminals 139A, 139B, specifically, the terminal 139A is electrically connected to the wiring pattern 137d. The remaining terminals including the terminal 139B output an electrical signal to indicate a change in diffused resistors according to the bending of the diaphragm portion 137a. The terminal 139A is soldered to an output electrode 105a of a drive circuit for driving the piezoelectric actuator that is provided on the circuit substrate 105. The output terminals including the terminal 139B are soldered to a plurality of detection electrodes 105b of the circuit substrate 105.

In this embodiment of the display apparatus with a touch panel, a pressing force is applied to the sphere 135 via the piezoelectric actuator 103 when the operator touches the front surface 101a of the touch panel 101 with a finger. In response to this, the terminal 139B of the semiconductor force sensor 131 outputs a signal required to detect the pressing force and then a detection circuit, not illustrated but provided on the circuit substrate 105, outputs a detection signal according to the pressing force. Upon receipt of the detection signal, the drive circuit for driving the piezoelectric actuator 103 feeds a drive signal to the input electrode 125B of the piezoelectric actuator 103 via the terminal 139A and the wiring pattern 137d of the semiconductor force sensor 131. Likewise, a drive signal is fed to the one input electrode 125A from the semiconductor force sensor 131A. In response to the drive signal, the piezoelectric actuator 103 is driven to vibrate the touch panel. As with the previous embodiment, the period for which the piezoelectric actuator 103 is vibrating may be determined by setting a timer. Alternatively, the piezoelectric actuator 103 may be set to vibrate while a detection signal is being output from the semiconductor force sensor.

In the display apparatus with a touch panel according to this embodiment, additional functionality may be provided, such as fast scrolling of a display screen according to the magnitude of the force applied to the touch panel as the semiconductor force sensor 131 detects the force applied to the touch panel 101.

As in this embodiment, when at least one of the pair of electrically conductive support members is constituted from a semiconductor force sensor 131, the semiconductor force sensor 131 detects the magnitude of a force caused by the vibration of the semiconductor force sensor itself when the piezoelectric actuator 103 vibrates. To solve this issue, a circuit provided on the circuit substrate 105 is configured not to detect such a force caused by the vibration of the semiconductor force sensor or is configured to subtract such a force from the magnitude of the force applied to the touch panel.

In this embodiment, both of the electrically conductive support members in the pair are each formed of a semiconductor force sensor. Alternatively, only one of the pair of electrically conductive support members may be formed of a semiconductor force sensor. In this configuration, the other electrically conductive support member in the pair may be formed of an electrically conductive foam shown in FIGS. 1 and 2.

Figure 5:
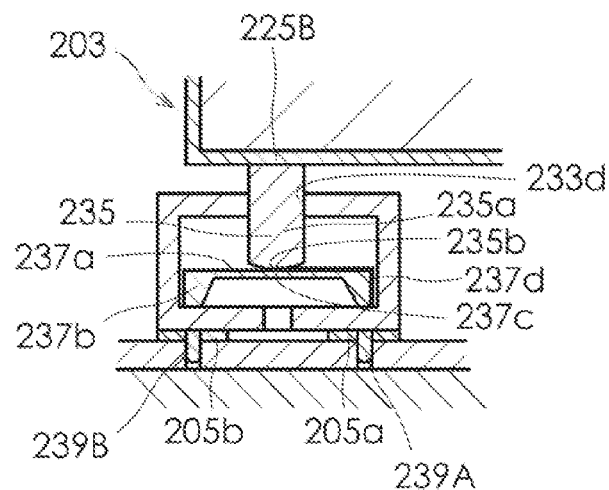
FIG. 5 is a partial cross sectional view of a display apparatus with a touch panel according to still another embodiment of the present invention.

FIG. 5 is a partial cross sectional view of a display apparatus with a touch panel according to still another embodiment of the present invention. Parts other than a contact are configured in the same manner as those of the embodiment shown in FIGS. 3 and 4. The similar parts to the embodiment shown in FIGS. 3 and 4 are allocated reference numerals or signs obtained by adding 100 to those of the parts of the previous embodiment, and descriptions thereof are omitted. In this embodiment, a contact 235 of a semiconductor force sensor 231, which has electrical conductivity, is fixed to an input electrode 225A or 225B of a piezoelectric actuator 203. The contact 235 is made of copper having electrical conductivity. The contact 235 includes a circular columnar portion 235a and a semi-spherical portion 235b formed at an end of the circular columnar portion 235a. The other end of the circular columnar portion 235a, which is opposed to the end where the semi-spherical portion 235b is located, is connected to the input electrode 225A or 225B by using solder. The semi-spherical portion 235b is in contact with the center of a diaphragm portion 237a of a semiconductor element 237.

In this embodiment, the contact 235 is fixed to the piezoelectric actuator 203, thereby effectively preventing contact failure between the contact 235 of the semiconductor force sensor 231 and the input electrodes 225A or 225B. Further, the piezoelectric actuator 203 may readily be positioned on the circuit substrate 205 merely by fitting the contact 235 in a casing 233 provided on the circuit substrate 205 for receiving the semiconductor force sensor 231.

Figure 6:
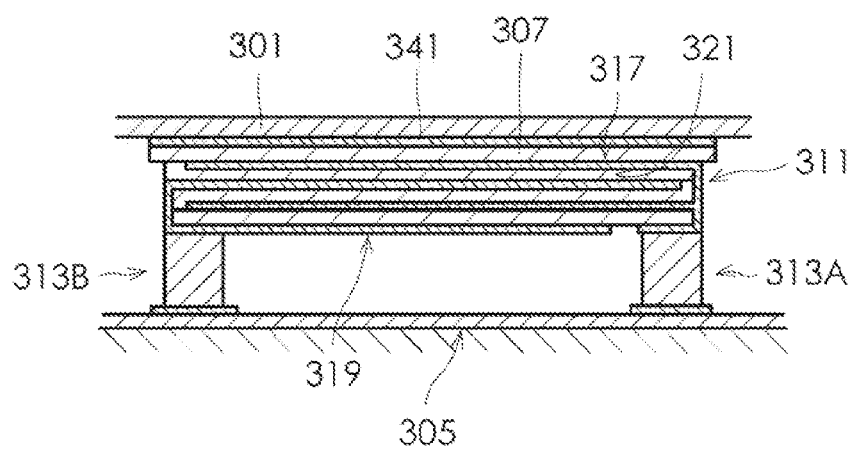
FIG. 6 is a partial cross sectional view of a display apparatus with a touch panel according to yet another embodiment of the present invention.

FIG. 6 is a partial cross sectional view of a display apparatus with a touch panel according to yet another embodiment of the present invention. Aspects other than the attachment of a piezoelectric actuator and a touch panel as well as a material for forming the touch panel are the same as those of the embodiment shown in FIGS. 1 and 2. The similar parts to the embodiment shown in FIGS. 1 and 2 are allocated reference numerals or signs obtained by adding 300 to those of the parts of the embodiment shown in FIGS. 1 and 2, and descriptions thereof are omitted. In this embodiment, a piezoelectric actuator 303 and a touch panel 301 are attached to each other via an adhesive layer 341 without using an elastic member. The touch panel 301 is formed of an acryl-based synthetic resin.

In the display apparatus with a touch panel according to this embodiment, the bending of the piezoelectric actuator 303 is directly transmitted to the touch panel 301 and then the touch panel 301 vibrates as if it waves. In this configuration, even if the touch panel is formed of a synthetic resin such as an acrylic resin, the touch panel may sufficiently vibrate.

Figure 7:
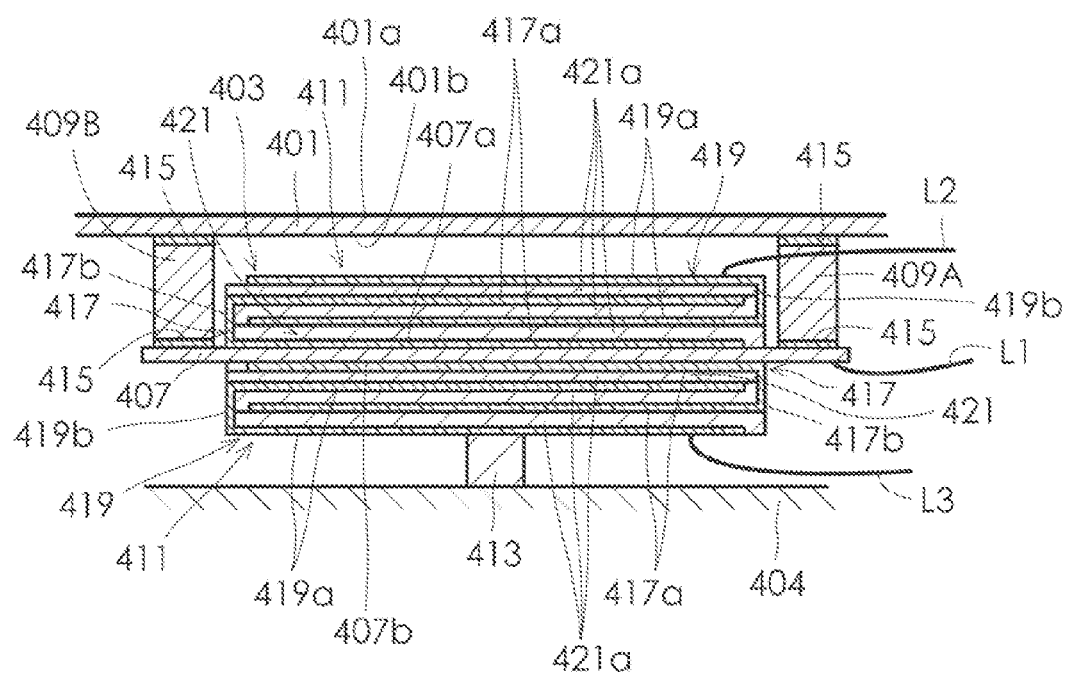
FIG. 7 is a partial cross sectional view of a display apparatus with a touch panel according to a further embodiment of the present invention.

FIG. 7 is a partial cross sectional view of a display apparatus with a touch panel according to a further embodiment of the present invention. In FIG. 7, the thickness dimension of a piezoelectric element 411 disposed on a metal diaphragm 407 is drawn with exaggeration, and accordingly those of elastic members 409A, 409B are also drawn with exaggeration. A piezoelectric actuator 403 used in a display apparatus with a touch panel according to this embodiment is shaped in an elongated plate. The piezoelectric actuator 403 includes the metal diaphragm 407, two elastic members 409A, 409B, two piezoelectric elements 411, and a support structure constituted from a support member 413. The piezoelectric actuator 403 is supported on an attachment portion 404 via the support member 413.

The metal diaphragm 407 may be made of stainless steel, 4-2 alloy, etc. and is shaped in an elongated rectangle. The metal diaphragm 407 has a front surface 407a and a back surface 407b. The front surface 407a is opposed to a back surface 401b of the touch panel 401 via the elastic members 409A, 409B.

The two piezoelectric elements 411 are formed on the front and back surfaces 407a, 407b of the metal diaphragm 407. The piezoelectric elements 411 each include a first electrically conductive portion 417, a second electrically conductive portion 419, and a piezoelectric portion 421. The first electrically conductive portion 417 includes two first electrically conductive layers 417a and a first coupling portion 417b for coupling the first electrically conductive layers 417a. Out of the two first electrically conductive layers 417a, the first electrically conductive layer 417a located to a side of the metal diaphragm 407 is attached to the metal diaphragm 407. Likewise, the second electrically conductive portion 419 includes two second electrically conductive layers 419a and a second coupling portion 419b for coupling the second electrically conductive layers 419a. The piezoelectric portion 421 includes three piezoelectric layers 421a formed of piezoelectric ceramic. One piezoelectric layer 421a is formed between one first electrically conductive layer 417a and one second electrically conductive layer 419a. Thus, the first electrically conductive layer 417a faces the second electrically conductive layer 419a via the piezoelectric layer 421a. The piezoelectric element 411 has a first side surface 411a and a second side surface 411b at ends thereof in a longitudinal direction thereof. The first coupling portion 417b and the second coupling portion 419b are respectively formed on the first side surface 411a and the second side surfaces 411b.

In this embodiment, the first electrically conductive portion 417 and the second electrically conductive portion 419 are formed by printing using a glass silver paste. The piezoelectric layer 421a is formed by sintering a green sheet of piezoelectric ceramic. The glass silver paste for forming the electrically conductive layers is also sintered at the same time as the green sheet is sintered. The sintering of the electrically conductive layers and the sintering of the piezoelectric layers may be done in an arbitrary order. The first coupling portion 417b of the first electrically conductive portion 417 and the second coupling portion 419b of the second electrically conductive portion 419 are formed after all of the electrically conductive layers and piezoelectric layers have been sintered. In the present embodiment, there are three piezoelectric layers 421a. In order to sufficiently increase the amplitude of the piezoelectric actuator, the first electrically conductive layers 417a, the second electrically conductive layers 419a, and the piezoelectric layers 421a may preferably be stacked so that there may be at least ten piezoelectric layers 421a.

The elastic members 409A, 409B are made of a synthetic resin material having elasticity. Specifically, "PORON H-48" available from Inoac Corporation is used as an elastic material. The elastic members 409A, 409B are disposed at ends of the piezoelectric actuator 403 as seen in the longitudinal direction. The elastic members 409A, 409B are respectively attached to a surface portion of the piezoelectric actuator 403, namely, the front surface 407a of the metal diaphragm 407, and the back surface 401b of the touch panel 401, using a double-faced adhesive tape 415. The piezoelectric actuator 403 and the touch panel 401 are thus configured to be mechanically coupled to each other.

The support member 413 is made of a synthetic resin material having elasticity as with the elastic members 409A, 409B. The support member 411 is disposed between an attachment portion 404 and a middle portion of the piezoelectric actuator 403 as seen in the longitudinal direction, namely, a middle portion of the piezoelectric element 411 opposed to the attachment portion 404. The support member 413 supports the piezoelectric actuator 403 on the surface of the attachment portion 404 such that the vibration of the piezoelectric actuator 403 may not be suppressed as much as possible. Thus, the piezoelectric actuator 403 is supported on the surface of the attachment portion 404 via the support member 413.

In this embodiment, a predetermined wiring is performed using a lead wire L1 connected to the metal diaphragm 407 and lead wires L2, L3 connected to the second electrically conductive portions 419 of the two piezoelectric elements 411.

INDUSTRIAL APPLICABILITY

According to the present invention, the piezoelectric actuator is supported on the front surface of the circuit substrate using the support structure constituted from the pair of electrically conductive support members having electrical conductivity and elasticity. The piezoelectric actuator may be mounted simply by locating the piezoelectric actuator with the pair of electrically conductive support members attached thereto in a predetermined position on the circuit substrate, and then connecting the pair of electrically conductive support members to the pair of output electrodes of the circuit substrate. Therefore, unlike conventional approaches, it may be possible to eliminate the need of using lead wires to connect the input electrodes of the piezoelectric actuator to the electrodes of the drive circuit for driving the piezoelectric actuator, thereby facilitating the mounting of the piezoelectric actuator.

The invention claimed is:

1. A display apparatus with a touch panel comprising:
a touch panel including a touch switch operable to detect that the touch switch is touched by an operator with a finger;
a piezoelectric actuator operable to vibrate the touch panel when the touch switch is touched by the operator with the finger, the piezoelectric actuator including a pair of input electrodes disposed at predetermined intervals on a back surface of the piezoelectric actuator;
a circuit substrate facing the back surface of the piezoelectric actuator and spaced away from a back surface of the touch panel, the circuit substrate including at least a drive circuit for driving the piezoelectric actuator, the drive circuit including a pair of output electrodes; and
a support structure for supporting the piezoelectric actuator on a front surface of the circuit substrate, disposed between the piezoelectric actuator and the circuit substrate, wherein:
the piezoelectric actuator is mechanically connected to the back surface of the touch panel such that vibration generated when the piezoelectric actuator is driven by the drive circuit may be transmitted to the touch panel;
the support structure is formed of a pair of electrically conductive support members having electrical conductivity and elasticity and capable of electrically connecting the pair of input electrodes of the piezoelectric actuator and the pair of output electrodes of the drive circuit; and
the pair of electrically conductive support members are disposed between the pair of input electrodes and the pair of output electrodes for supporting the piezoelectric actuator such that the vibration of the piezoelectric actuator may not be suppressed as much as possible.

2. The display apparatus with a touch panel according to claim 1, wherein:
the pair of electrically conductive support members are each formed of an electrically conductive foam;
the piezoelectric actuator has a shape of an elongated plate;
the pair of input electrodes are disposed on both ends of the piezoelectric actuator, the both ends being opposed in a longitudinal direction of the piezoelectric actuator; and
an elastic member is provided for mechanically connecting the piezoelectric actuator and the touch panel, and is connected to a front surface portion of the piezoelectric actuator and the back surface of the touch panel, the front surface portion being opposed to a middle portion between the pair of input electrodes.

3. The display apparatus with a touch panel according to claim 2, wherein the touch panel is made of glass.

4. The display apparatus with a touch panel according to claim 2, wherein:
the piezoelectric actuator includes:
a metal diaphragm having a front surface and a back surface, the front surface facing the back surface of the touch panel; and
a piezoelectric element formed on the back surface of the metal diaphragm, the piezoelectric element including:
a first electrically conductive portion connected to the metal diaphragm;
a piezoelectric portion;
a second electrically conductive portion opposed to the first electrically conductive portion via the piezoelectric portion; and
an electrically conductive connecting path connected to the first electrically conductive portion;
a part of the electrically conductive connecting path and a part of the second electrically conductive portion are formed at portions of the piezoelectric element that face the circuit substrate;
one of the input electrodes is formed by the part of the electrically conductive connecting path; and
the other of the input electrodes is formed by the part of the second electrically conductive portion.

5. The display apparatus with a touch panel according to claim 4, wherein:
the piezoelectric portion includes a plurality of piezoelectric layers;
the first electrically conductive portion includes a plurality of first electrically conductive layers and a first coupling portion for coupling the first electrically conductive layers;
the second electrically conductive portion includes a plurality of second electrically conductive layers and a second coupling portion for coupling the second electrically conductive layers, the second electrically conductive layer facing the first electrically conductive layer via the piezoelectric layer;
the piezoelectric element includes a first side surface and a second side surface at both ends thereof in the longitudinal direction, and the first and second coupling portions are respectively formed on the first and second side surfaces;
the electrically conductive connecting path includes a side connecting portion and an opposed connecting portion, the side connecting portion being formed on the first side surface which is partially constituted from a side part of an outermost piezoelectric layer in the piezoelectric layers that faces the circuit substrate, the opposed connecting portion being formed on a surface of the outermost piezoelectric layer that faces the circuit substrate; and
the side connecting portion is connected to the first coupling portion.

6. The display apparatus with a touch panel according to claim 1, wherein:
the pair of electrically conductive support members are each formed of an electrically conductive foam;
the piezoelectric actuator has a shape of an elongated plate;
the pair of input electrodes are disposed on both ends of the piezoelectric actuator, the both ends being opposed in a longitudinal direction of the piezoelectric actuator; and
the piezoelectric actuator and the touch panel are attached to each other via an adhesive layer.

7. The display apparatus with a touch panel according to claim 6, wherein the touch panel is made of a synthetic resin.

8. A display apparatus with a touch panel comprising:
a touch panel including a touch switch operable to detect that the touch switch is touched by an operator with a finger;
a piezoelectric actuator operable to vibrate the touch panel when the touch switch is touched by the operator with the finger, the piezoelectric actuator including a pair of input electrodes disposed at predetermined intervals on a back surface of the piezoelectric actuator;
a circuit substrate facing the back surface of the piezoelectric actuator and spaced away from a back surface of the touch panel, the circuit substrate including at least a drive circuit for driving the piezoelectric actuator, the drive circuit including a pair of output electrodes; and a support structure for supporting the piezoelectric actuator on a front surface of the circuit substrate, disposed between the piezoelectric actuator and the circuit substrate, wherein:
the piezoelectric actuator is mechanically connected to the back surface of the touch panel such that vibration generated when the piezoelectric actuator is driven by the drive circuit may be transmitted to the touch panel;
the support structure is formed of a pair of electrically conductive support members having electrical conductivity and capable of electrically connecting the pair of input electrodes of the piezoelectric actuator and the pair of output electrodes of the drive circuit;
the pair of electrically conductive support members are disposed between the pair of input electrodes and the pair of output electrodes for supporting the piezoelectric actuator;
at least one of the electrically conductive support members is formed of a force sensor operable to detect the magnitude of a force applied to the touch panel by the operator with the finger; and
the force sensor includes a contact having electrical conductivity and configured to be in contact with the corresponding input electrode, and an electrically conductive path including the contact and electrically connected to the output electrode on the circuit substrate.

9. The display apparatus with a touch panel according to claim 8, wherein:
the force sensor includes a semiconductor element operable to bend according to a transition of the contact and having a plurality of diffused resistors formed thereon, the diffused resisters being operable to output an electrical signal according to an amount of bending of the semiconductor element;
the contact is formed of an electrically conductive sphere; and
the electrically conductive path includes a contact electrode formed on the semiconductor element to be in contact with the sphere and a wiring pattern formed on the semiconductor element and electrically connected to the contact electrode.

10. A display apparatus with a touch panel comprising:
a touch panel including a touch switch operable to detect that the touch switch is touched by an operator with a finger;
a piezoelectric actuator operable to vibrate the touch panel when the touch switch is touched by the operator with the finger, the piezoelectric actuator including a pair of input electrodes disposed at predetermined intervals on a back surface of the piezoelectric actuator;
a circuit substrate facing the back surface of the piezoelectric actuator and spaced away from a back surface of the touch panel, the circuit substrate including at least a drive circuit for driving the piezoelectric actuator, the drive circuit including a pair of output electrodes; and
a support structure for supporting the piezoelectric actuator on a front surface of the circuit substrate, disposed between the piezoelectric actuator and the circuit substrate, wherein:
the piezoelectric actuator is mechanically connected to the back surface of the touch panel such that vibration generated when the piezoelectric actuator is driven by the drive circuit may be transmitted to the touch panel;
the support structure is formed of a pair of electrically conductive support members having electrical conductivity and capable of electrically connecting the pair of input electrodes of the piezoelectric actuator and the pair of output electrodes of the drive circuit;
the pair of electrically conductive support members are disposed between the pair of input electrodes and the pair of output electrodes for supporting the piezoelectric actuator;
at least one of the electrically conductive support members is formed of a force sensor operable to detect the magnitude of a force applied to the touch panel by the operator with the finger; and
the force sensor includes a contact having electrical conductivity and fixed to the corresponding input electrode, and an electrically conductive path including the contact and electrically connected to the output electrode on the circuit substrate.

11. A display apparatus with a touch panel comprising:
a drive circuit;
a touch panel including a touch switch operable to detect that the touch switch is touched by an operator with a finger;
a piezoelectric actuator operable to vibrate the touch panel when the touch switch is touched by the operator with the finger, the piezoelectric actuator including:
a metal diaphragm having a front surface and a back surface; and
piezoelectric elements formed on both of the front and back surfaces of the metal diaphragm;
an attachment portion to which the piezoelectric actuator is to be attached, spaced away from a back surface of the touch panel; and
a support structure for supporting the piezoelectric actuator on the attachment portion, disposed between the piezoelectric actuator and the attachment portion, wherein:
the piezoelectric actuator is mechanically connected to the back surface of the touch panel such that vibration generated when the piezoelectric actuator is driven by the drive circuit may be transmitted to the touch panel;
the piezoelectric actuator has a shape of an elongated plate;
the support structure has elasticity and is disposed between a central portion of the piezoelectric actuator in a longitudinal direction thereof and the attachment portion such that the vibration of the piezoelectric actuator may not be suppressed as much as possible; and
an elastic member is provided on each end of the piezoelectric actuator in the longitudinal direction for mechanically connecting the piezoelectric actuator and the touch panel, and is connected to a front surface portion of the actuator and also to the back surface of the touch panel.

* * * * *